US006431807B1

United States Patent
Stevens et al.

(10) Patent No.: US 6,431,807 B1
(45) Date of Patent: Aug. 13, 2002

(54) WAFER PROCESSING ARCHITECTURE INCLUDING SINGLE-WAFER LOAD LOCK WITH COOLING UNIT

(75) Inventors: Craig Stevens, Ben Lomond; Tony Jakubiec, San Jose, both of CA (US)

(73) Assignee: Novellus Systems, Inc., San Jose, CA (US)

( * ) Notice: Subject to any disclaimer, the term of this patent is extended or adjusted under 35 U.S.C. 154(b) by 0 days.

(21) Appl. No.: 09/346,258

(22) Filed: Jun. 30, 1999

Related U.S. Application Data
(60) Provisional application No. 60/092,242, filed on Jul. 10, 1998.

(51) Int. Cl.$^7$ ................................................ B65G 47/00
(52) U.S. Cl. .................... 414/217; 414/805; 414/939; 414/941
(58) Field of Search ................. 414/217, 805, 414/939, 941, 222.01, 225.01, 403, 411, 414, 416, 806, 810, 811

(56) References Cited

U.S. PATENT DOCUMENTS

| | | | | |
|---|---|---|---|---|
| 4,042,128 A | * | 8/1977 | Shrader ................... | 414/939 X |
| 4,228,358 A | * | 10/1980 | Ryding ................... | 414/939 X |
| 4,705,951 A | * | 11/1987 | Layman et al. ......... | 414/217 X |
| 4,795,299 A | * | 1/1989 | Boys et al. ............. | 414/217 |
| 4,851,101 A | * | 7/1989 | Hutchinson ............ | 414/217 X |
| 5,135,608 A | | 8/1992 | Okutani | |
| 5,186,594 A | | 2/1993 | Toshima et al. | |
| 5,314,541 A | | 5/1994 | Saito et al. | |
| 5,372,471 A | * | 12/1994 | Wu ......................... | 414/217 X |
| 5,512,320 A | | 4/1996 | Turner et al. | |
| 5,518,542 A | * | 5/1996 | Matsukawa et al. ..... | 414/941 X |
| 5,676,590 A | * | 10/1997 | Hiraoka .................. | 414/797 X |
| 5,753,133 A | * | 5/1998 | Wong et al. ............ | 414/939 X |
| 5,855,681 A | | 1/1999 | Maydan et al. | |
| 5,882,165 A | | 3/1999 | Maydan et al. | |
| 5,902,088 A | * | 5/1999 | Fairbairn et al. ........... | 414/217 |
| 5,961,722 A | * | 10/1999 | Buhrer et al. ........... | 414/217 X |
| 6,007,675 A | * | 12/1999 | Toshima ................. | 414/217 X |
| 6,048,154 A | | 4/2000 | Wytman | |

FOREIGN PATENT DOCUMENTS

| | | |
|---|---|---|
| EP | 0834907 A2 | 4/1998 |
| WO | WO99/03133 | 1/1999 |

OTHER PUBLICATIONS

O'Hanlon, J. et al., "Reduction of Water Aerosol Contamination During Pumping Of A Vacuum Chamber From Atmospheric Pressure" *Journal of Vacuum Science and Technology* (1991).

* cited by examiner

*Primary Examiner*—Robert P. Olszewski
*Assistant Examiner*—Gerald J. O'Connor
(74) *Attorney, Agent, or Firm*—Skjerven Morrill LLP

(57) ABSTRACT

A wafer processing system includes a single-wafer load lock with integrated cooling unit. The small volume of the single-wafer load lock allows for fast pump down and vent cycles. By integrating a cooling unit within the load lock, system throughput is further increased by eliminating the need to move a newly processed wafer to a separate cooling unit before moving the wafer to the load lock.

11 Claims, 4 Drawing Sheets

WAFER PROCESSING ARCHITECTURE INCLUDING SINGLE-WAFER LOAD LOCK WITH COOLING UNIT

CROSS REFERENCE TO RELATED APPLICATION

This application claims priority from U.S. Provisional Application No. 60/092,242 filed Jul. 10, 1998.

BACKGROUND OF THE INVENTION

1. Field of the Invention

The invention generally relates to semiconductor device manufacturing equipment.

2. Description of the Related Art

In the semiconductor industry, special wafer processing systems are used to convert bare semiconductor wafers into working devices. Typically, the wafer processing system has a reactor for processing wafers and a wafer handling system for moving wafers to and from the reactor. The reactor or process module is where wafer processing such as film deposition or etching occurs. The wafer handling system is mechanically coupled to the reactor and has a loading station on which wafers can be loaded from the factory floor. Once loaded onto the loading station, wafers are transferred to and from reactors using mechanical manipulators such as robots.

FIG. 1 shows a wafer processing system in the prior art. Wafer processing system 1 includes a reactor 2 and a wafer handler 3. Wafer handler 3 further includes a user interface 4, a loading station 5, load locks 7A and 7B, and a transfer chamber 6. User interface 4 has a display terminal for entering and reading information and a computer system (not shown) for controlling the operation of wafer processing system 1.

A typical wafer handling sequence for wafer processing system 1 is as follows. Wafer cassette or carrier 10 is moved from loading station 5 into load lock 7A by an indexer robot 28A. Pressure within load lock 7A is decreased using a vacuum pump (not shown). When the desired pressure differential between transfer chamber 6 and load lock 7A is reached, load lock 7A is opened to transfer chamber 6 and a wafer 11 is picked up from wafer carrier 10 and then transferred to reactor 2 by vacuum robot 9. Wafer 11 is then processed inside reactor 2. When processing is completed, wafer 11 is moved from reactor 2 and placed into a cooling station 8 by vacuum robot 9. Cooling of wafer 11 is required because wafer processing temperatures can reach as high as 650° C. whereas wafer carrier 10 typically has a limitation of 70° C., beyond which deformation begins. When cooled, vacuum robot 9 transfers wafer 11 from cooling station 8 and into its original wafer carrier (carrier 10) inside load lock 7A. The other wafers in carrier 10 are processed in a similar manner. After all wafers originally contained in wafer carrier 10 have been processed, load lock 7A is vented to atmospheric pressure, after which cassette 10 is transferred from load lock 7A back to loading station 5.

Load locks 7A and 7B function as transition chambers between transfer chamber 6, which is maintained under vacuum, and loading station 5, which is at atmospheric pressure. Load locks 7A and 7B are referred to as batch load locks because they accommodate multiple wafers, typically in a carrier, at a time. Because load locks 7A and 7B do not have an integral cooling unit, cooling station 8 must be provided within transfer chamber 6. Providing cooling station 8 outside load lock 7A significantly cuts down on the number of wafers that can be processed within a given amount of time because vacuum robot 9 has to move a processed wafer to cooling station 8 before moving the processed wafer into load lock 7A.

In a batch load lock, pump down and vent operations take time because batch load locks must have a volume large enough to accommodate multiple wafers. The long pump down and vent times of the batch load lock adversely affect the wafer processing system's throughput or the number of wafers that the system can process within a given amount of time. This throughput problem is compounded when the system is used with partially filled wafer carriers, as is the case in many factories, specially those involved in custom device fabrication.

The large volume and large internal surface area of batch load locks raise micro-contamination problems. The walls of a load lock adsorb moisture every time the load lock is vented and exposed to atmospheric pressure. This moisture outgasses at operating pressures, creating partial pressure build-up of gases such as, for example, $H_2O$, $N_2$, or $O_2$ in the transfer chamber and the reactor. The larger the load lock, the greater the chance of micro-contaminants entering the transfer chamber and reactor. Further, the load lock must be pumped down to a pressure slightly lower than that of the transfer chamber to prevent micro-contaminants from getting into the transfer chamber. Obtaining this lower pressure takes additional time in a batch load lock because of its large volume.

In order to alleviate the throughput problems associated with batch load locks, some batch load lock systems transfer multiple wafers at a time from the loading station to the load locks. A problem with this approach is that moving multiple wafers at a time increases the chance of wafer handling errors or breakage. Further, all ancillary wafer operations such as wafer alignment, wafer ID reading, and metrology must be performed inside the load lock or transfer chamber under vacuum. This leads to increased complexity and implementation cost.

U.S. Pat. No. 5,512,320 to Turner et. al., incorporated herein by reference, discloses a batch load lock with an integral metallic carrier for cooling processed wafers. In Turner, as in any batch load locks, an elevator is required for incrementally raising each shelf of the metallic carrier to the same level as the vacuum robot or an external atmospheric robot. Because the elevator must be precisely controlled for proper wafer exchange with the vacuum and atmospheric robots, the elevator is essentially a robot which not only complicates but also raises the cost of the wafer processing system. Further, Turner suffers from the same problems associated with batch load locks in the prior art.

Thus, there is a clear need for a wafer processing system that has better throughput, has better contamination control, and is less expensive to implement than those in the prior art.

SUMMARY OF THE INVENTION

The invention provides for a modular wafer processing system. In accordance with the invention, the modular wafer processing system includes a single-wafer load lock with an integrated cooling unit. The provision for an integrated cooling unit provides for increased system throughput because processed wafers can be directly transferred from the reactor and into the load lock. Throughput is further increased by reducing the volume of the single-wafer load lock to allow for fast pump down and vent times.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

Figure 2:
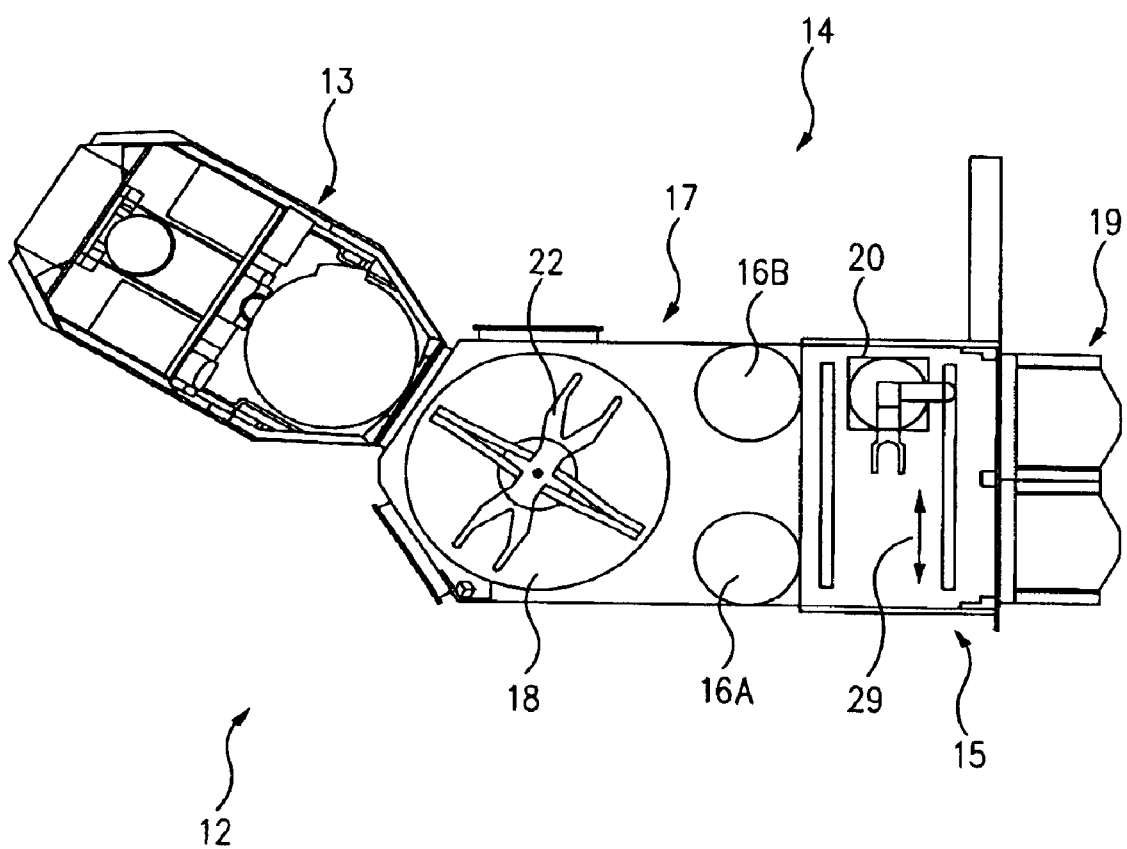
FIG. 2 is a top view of a wafer processing system in accordance with the present invention.

FIG. 2 shows an embodiment of a wafer processing system according to the present invention. Modular wafer processing system 12 comprises a process module or reactor 13 and a wafer transfer system (WTS) 14. An example of modular wafer processing system 12 is the model CONCEPT-3™ wafer processing system manufactured by Novellus Systems, Inc. of San Jose, Calif. Reactor 13 in this particular example is a chemical vapor deposition reactor but could be any semiconductor manufacturing reactor such as those used for etching or physical vapor deposition. Wafer processing system 12 can accommodate a plurality of reactors but only one is shown for clarity of illustration.

Figure 3:
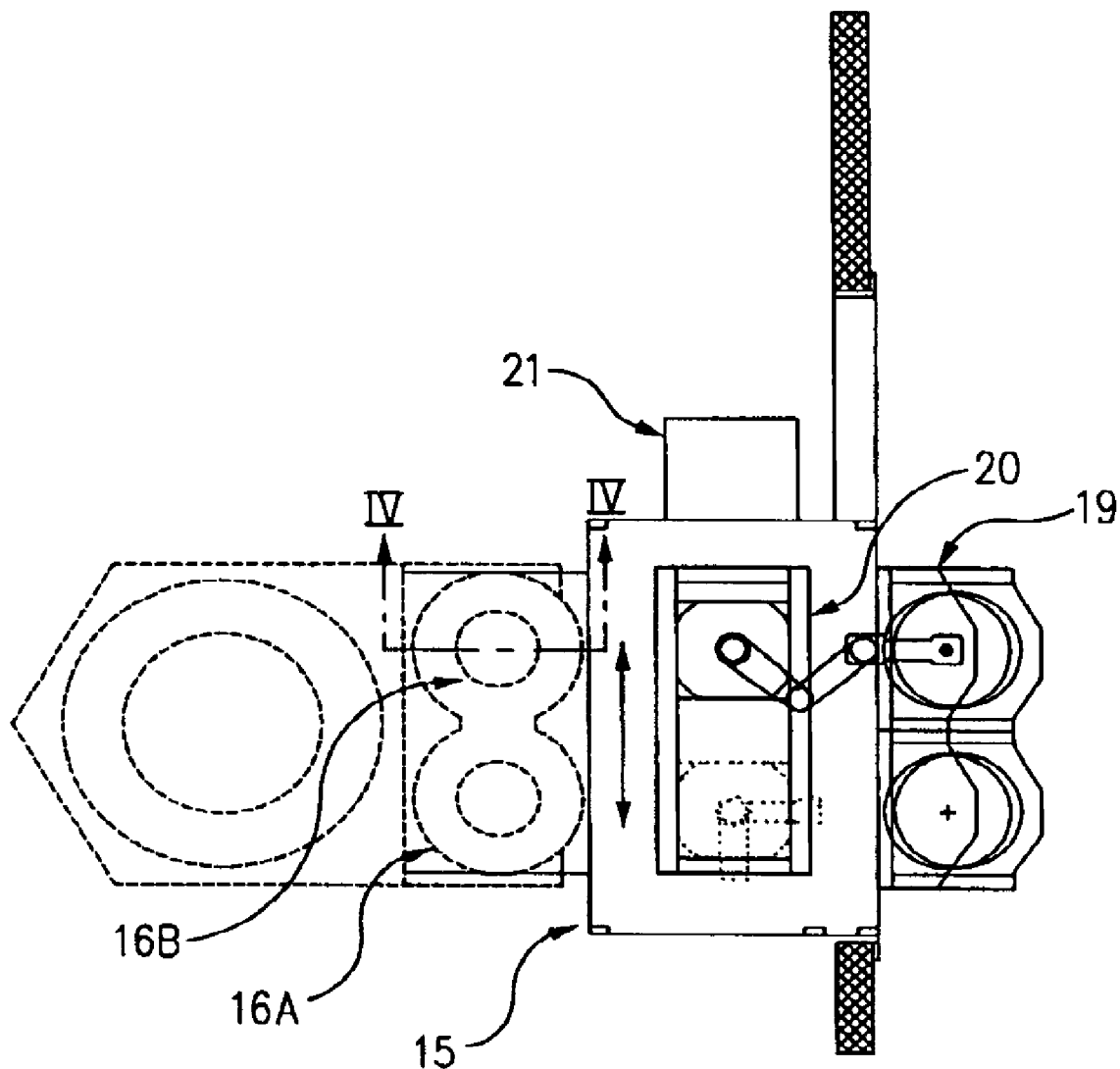
FIG. 3 is a top view showing a location for optional devices which can be used with a wafer processing system in accordance with the present invention.

WTS 14 further includes a front end module 15 and a transfer module 17. Front end module 15 includes a loading station 19 for loading and unloading of wafers which are typically in a wafer carrier. Loading station 19 can accommodate commercially available interfaces such as pod loaders or open cassette stages. Front end module 15 also includes an atmospheric robot 20 for moving wafers between loading station 19 and single-wafer load locks 16A and 16B. Atmospheric robot 20 is a conventional 3-axis robot mounted on a fourth translation axis for movement in the direction shown by arrow 29. An example of atmospheric robot 20 is the model 400 Series from Equipe Technologies of Sunnyvale, Calif. The use of other robot configurations are also possible. To minimize wafer handling errors and to simplify wafer ancillary operations, atmospheric robot 20 is designed to pick up one wafer at a time from loading station 19. As shown in FIG. 3, front end module 15 can also be fitted with a wafer aligner and/or protective electrostatic cover (PEC) storage in location 21. The wafer aligner is used for detecting the XY offset of the wafer as well as wafer notch orientation. The wafer aligner can be any standard wafer aligner unit which is readily available in the semiconductor industry. The PEC consists of one or more horizontally placed shelves located above the wafer aligner.

As shown in FIG. 2, transfer module 17 comprises a transfer chamber 18 and single-wafer load locks (SWLL) 16A and 16B. Transfer chamber 18 includes a vacuum robot 22, a 3-axis polar coordinate robot with two opposing end effectors, for moving wafers between reactor 13 and SWLL 16A and 16B. An example of vacuum robot 22 is the MAGNATRAN™ Model MAG-7 from Brooks Automation Inc. of Chelmsford, Mass. Any conventional robot may be used without detracting from the merits of the invention. SWLL 16A and 16B are transition chambers between transfer chamber 18, which is maintained under vacuum, and front end module 15, which is at atmospheric pressure. Although the following discussion will be equally applicable to either SWLL 16A or SWLL 16B, only SWLL 16A will be referred to in the interest of clarity. For example, while a description recites moving a wafer to SWLL16A, it is to be understood that the same wafer can be moved to either SWLL16A or SWLL16B, whichever is available.

Figure 4:
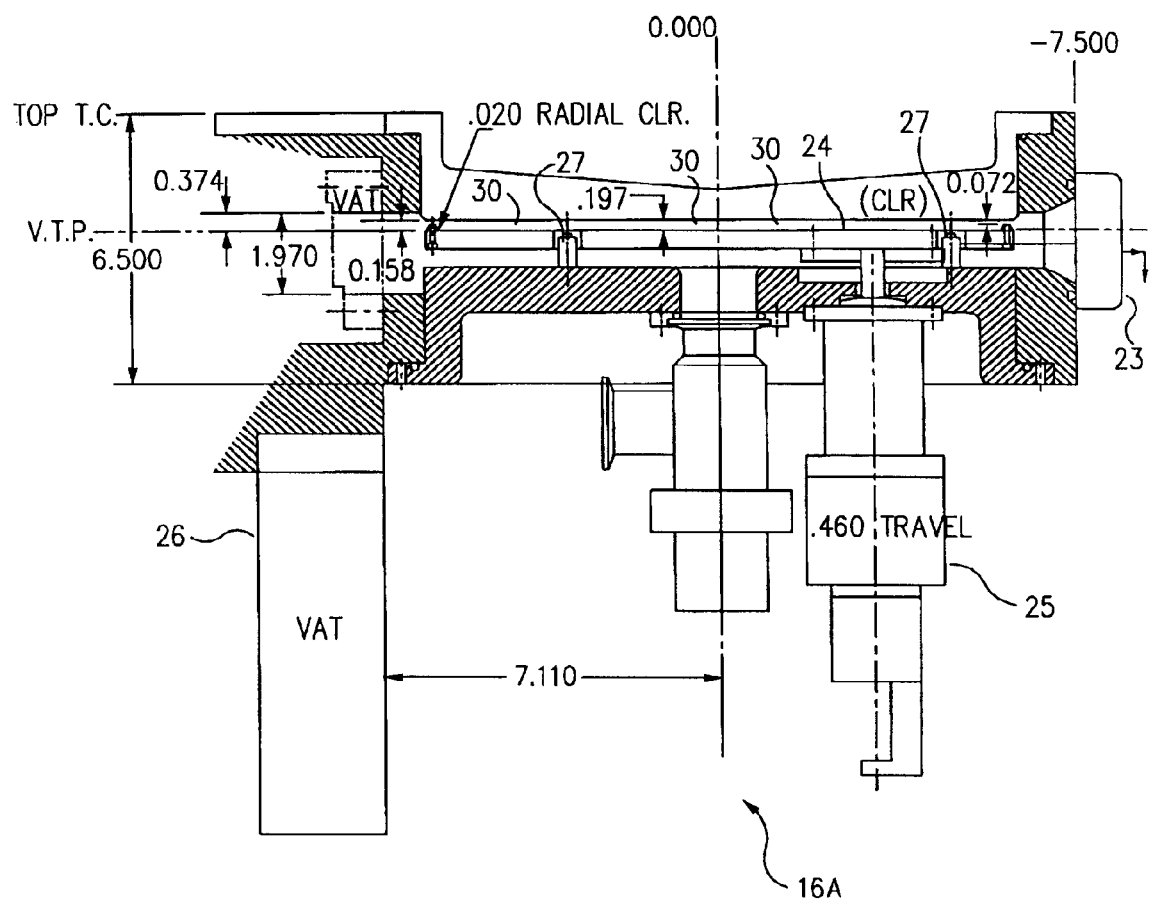
FIG. 4 is a cross-section taken about line IV—IV of FIG. 3, showing a single-wafer load lock in accordance with the present invention.

FIG. 4 shows a cross-section of SWLL 16A taken at IV—IV in FIG. 3. Unlike load locks in the prior art, SWLL 16A is a reduced volume load lock and can accommodate only one wafer at a time. SWLL 16A's reduced volume and correspondingly reduced internal surface area allow for better micro-contamination control.

SWLL 16A's small volume provides for maximum system throughput. Because SWLL 16A has a volume of about 5.0 liters, for example, it is capable of pump down and vent times of 10 seconds or less. In contrast, batch load locks typically have a volume greater than 90 liters and can take as long as 3 minutes to pump down or vent. The fast pump down and vent times of SWLL 16A reduce the amount of time a wafer spends in the system (wafer cycle time). Short wafer cycle times provide for high system throughput. Appendix 1 shows load and unload time calculations for various load lock architectures while Appendix 2 shows the corresponding cycle times. Note that although SWLL 16A must be loaded and unloaded 25 times in a 25 wafer run, only the first load and unload cycle affects system throughput. This is because SWLL16A can pump down and vent faster than the vacuum robot can move a wafer from SWLL16A to a reactor and from a reactor to SWLL16A. In other words, vacuum robot 22 does not have to wait for SWLL16A to be available. Thus, a batch load lock's capability to process multiple wafers in a single load and unload cycle does not compensate for the batch load lock's long pump down and vent times.

As shown in FIG. 4, SWLL 16A includes a door 23, a pedestal 24, a pedestal lift 25, a slit valve 26, and a plurality of pins 27. Door 23 faces front end module 15 and allows atmospheric robot 20 to access SWLL 16A while slit valve 26 faces transfer chamber 18 to provide access for vacuum robot 22. Slit valve 26, a widely known component in the semiconductor industry, has a gate which moves in a vertical direction for sealing or opening SWLL 16A. An example of slit valve 26 is the model VAT Series 03 Type-L from VAT, Inc. of Woburn, Mass. To seal SWLL 16A, door 23 is closed and slit valve 26 is placed in the up position.

Figure 1:
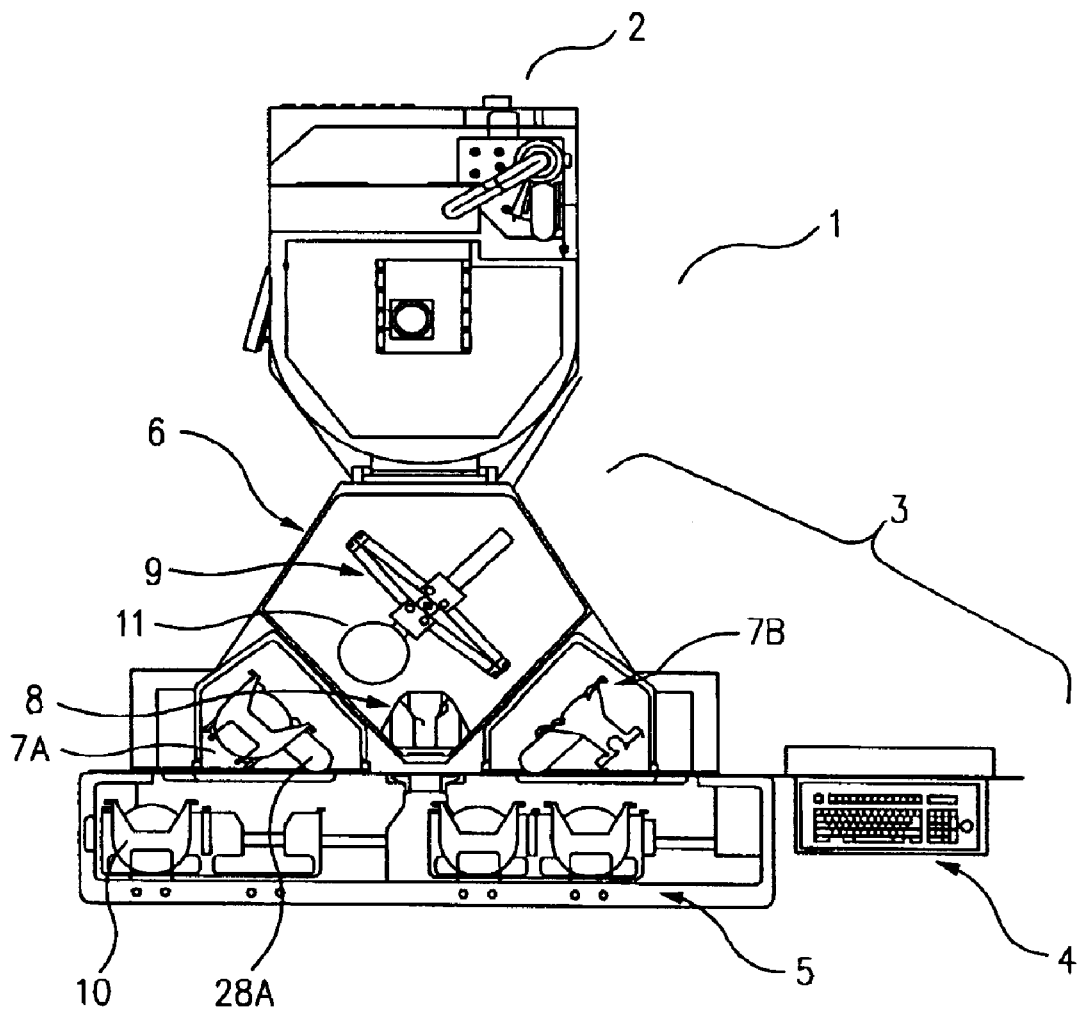
FIG. 1 is a top view of a wafer processing system in the prior art.

Pedestal 24 supports the wafer while SWLL 16A is being pumped down to vacuum or vented to atmospheric pressure. For cooling the wafer, pedestal 24 is water cooled using conventional methods. For example, plumbing can be routed through pedestal lift 25 to supply water to cooling channels 30 within pedestal 24. U.S. Pat. No. 5,512,320 to Turner et. al., incorporated herein by reference, also discloses liquid cooling means. Other cooling methods can also be used without detracting from the merits of the present invention. Because a cooling unit in the form of water cooled pedestal 24 is integrated within SWLL 16A, vacuum robot 22 can move a processed wafer directly to SWLL 16A instead of having to move the processed wafer to a separate cooling station, saving a move step and increasing throughput. In comparing the architectures of WTS 14 and wafer handler 3 (shown in FIG. 1), it is evident that WTS 14 requires the wafer to be moved by vacuum robot 22 only twice (load lock to reactor, reactor to load lock) whereas wafer handler 3 requires the wafer to be moved 3 times (load lock to reactor, reactor to cooling station, cooling station to load lock). Assuming each wafer movement takes 10 seconds, throughput for WTS 14 and wafer handler 3 can be calculated as shown in Table 1. Thus, considering vacuum robot 22 as the limiting component of WTS 14, the present invention can realize an increased throughput of 60 wafers per hour (180 wph–120 wph), or a 50% increase over wafer handler 3.

TABLE 1

|  | Number of Moves | Door to Door Time (sec) | Throughput (wph) |
|---|---|---|---|
| WTS 14 | 2 | 20 | 180 |
| Wafer Handler 3 | 3 | 30 | 120 |

Pedestal lift 25 provides vertical travel for pedestal 24 to allow the wafer to be lifted from or placed on pins 27 during wafer exchange. Unlike the elevators or indexer robots used in batch load locks, pedestal lift 25 only has an up and a down position. Those skilled in the art will appreciate that a two position lift does not need precise control and can be actuated using, for example, low-cost conventional pneumatic methods. Further, pins 27 define a fixed wafer pick-up or placement point for both vacuum robot 22 and atmospheric robot 20, simplifying robot alignment requirements in the system.

Wafer transfer and processing according to the teachings of the present invention are now described. A wafer carrier containing pre-processed wafers is loaded onto loading station 19 shown in FIG. 2. Ancillary wafer operations, such as wafer mapping, are performed on the pre-processed wafers. Atmospheric robot 20 then picks up a single pre-processed wafer from loading station 19 and places the pre-processed wafer through door 23 onto pins 27 within SWLL 16A or SWLL 16B, whichever is available. If an optional wafer aligner, wafer ID reader, or metrology unit is installed, the pre-processed wafer is moved to said optional units in location 21 shown in FIG. 4 before the pre-processed wafer is placed on pins 27 inside SWLL 16A (or SWLL 16B). SWLL 16A is sealed (i.e. door 23 and slit valve 26 are closed) and, simultaneously, pedestal 24 is lifted to raise the pre-processed wafer from pins 27. SWLL 16A is then pumped down. When the desired pressure differential between transfer chamber 18 and SWLL 16A is reached, slit valve 26 is opened (i.e. placed in the down position) while, simultaneously, pedestal 24 is lowered to rest the pre-processed wafer on pins 27. Vacuum robot 22 picks up the pre-processed wafer from pins 27 and moves the pre-processed wafer into reactor 13 for processing. Subsequently, vacuum robot 22 picks up a processed wafer from reactor 13 and places the processed wafer on pins 27 within SWLL 16A or 16B, whichever is available. Once the processed wafer is inside SWLL 16A (or SWLL 16B), slit valve 26 is closed (i.e. placed in the up position) and pedestal 24 is lifted to raise the processed wafer from pins 27. While SWLL 16A is vented to atmospheric pressure, pedestal 24 cools the processed wafer to a temperature below 70° C. When SWLL 16A reaches atmospheric pressure, door 23 opens and pedestal 24 is lowered to rest the processed wafer on pins 27. Atmospheric robot 20 picks up the processed wafer from pins 27 for movement to loading station 19, completing the wafer processing cycle. During vent operations and during wafer exchange with atmospheric robot 20, it is desirable to purge SWLL 16A with an inert gas, such as nitrogen, argon, or helium, to prevent moisture from adsorbing onto the surfaces of the load lock.

The above detailed description is provided to illustrate the specific embodiments of the present invention and is not intended to be limiting. It is to be understood that numerous variations and modifications within the scope of the present invention are possible. For example, robots and cooling methods which are different from that disclosed herein can be used without detracting from the merits of the present invention. Further, the invention can be used for moving wafers in a variety of semiconductor manufacturing applications. The invention is set forth in the following claims:

APPENDIX 1

|  | WTS | Batch Load lock | Batch Load lock with Cool |
|---|---|---|---|
| Load Step |  |  |  |
| Load Pod or Cassette | 5 | 10 | 5 |
| Map Wafers | 20 | 0 | 20 |
| Get Wafer From Cassette | 2 |  | 2 |
| Translate Atmospheric Robot to Load Lock | 2 |  | 2 |
| Put Wafer Into Load Lock | 2 |  | 2 |
| Close Load Lock door | 2 | 2 | 2 |
| Pump Down Load Lock | 10 | 180 | 180 |
| Open Load Lock Slit Valve | 1 | 1 | 1 |
| Vacuum Robot Gets Wafer From Load Lock | 4 | 4 | 4 |
| Vacuum Robot Rotates To Process Module | 2 | 2 | 2 |
| Vacuum Robot Puts Wafer Into Process Module | 4 | 4 | 4 |
| Load Time Total | 54.0 | 203.0 | 224.0 |
| Unload Step |  |  |  |
| Vacuum Robot Rotates To Process Module | 2 | 2 | 2 |
| Vacuum Robot Gets Wafer from Process Module | 4 | 4 | 4 |
| Vacuum Robot Rotates to Cooling Station |  |  | 2 |
| Vacuum Robot Puts Wafer to Cooling Station |  |  | 4 |
| Cool Time |  |  | 30 |
| Vacuum Robot Gets Wafer from Cooling Station |  |  | 4 |
| Vacuum Robot Rotates to Load Lock | 2 | 2 | 2 |
| Vacuum Robot Puts Wafer into Load lock | 4 | 4 | 4 |
| Close Load Lock Slit Valve | 1 | 1 | 1 |
| Vent Load Lock | 10 | 120 | 120 |
| Open Load Lock door | 2 | 2 | 2 |
| Get Wafer from Load Lock | 2 | 0 | 2 |
| Translate Atmospheric Robot to Load Lock | 3 | 0 | 3 |
| Put Wafer Into Cassette | 2 | 0 | 2 |
| Unload Pod or Cassette | 5 | 10 | 5 |
| Unload Time Total | 37.0 | 185.0 | 147.0 |

| Process Module Exchange | Time |
|---|---|
| Vacuum Robot Rotates to Process Module | 2 |
| Put Wafer Into Process Module | 4 |
| Vacuum Robot Rotates 180° | 3 |
| Vacuum Robot Gets Wafer From Process Module |  4 |
| Process Module Exchange Time Total | 13.0 |

Note: Times are approximations based on actual system performance.

APPENDIX 2

Wafer Cycle Time Summary

|  | Load (sec) | Unload (sec) | Process Module Exchange (sec) | Total (min) |
|---|---|---|---|---|
| WTS | 54.0 | 37.0 | 13.0 | 1.7 |
| Batch Load lock | 203.0 | 185.0 | 13.0 | 6.7 |
| Batch Load lock with Cool | 224.0 | 147.0 | 13.0 | 6.4 |

Assumptions
(1) Times indicated are for one wafer to cycle through system with no WIP in the tool.
(2) Process time in process module is zero. Actual wafer cycle time would include time wafer is in process module plus the above overhead.
(3) Robot and slit valve times are constant for all applications.
(4) Cool time for batch load lock is assumed to be 30 seconds.
(5) Batch load lock vent/pump times are for a 200 mm system. Actual 300 mm load lock pump/vent times would be longer.

What is claimed is:

1. A system for processing a semiconductor wafer comprising:
   (a) a loading station;
   (b) a single-wafer load lock, the load lock containing one and only one wafer holder, the wafer holder being adapted to hold one and only one wafer, the load lock further containing a cooling unit;
   (c) a first robot for moving the wafer between the loading station and the single-wafer load lock;
   (d) a reactor; and
   (e) a transfer chamber in communication with the reactor and the single-wafer load lock, the transfer chamber having a second robot for moving the wafer between the single-wafer load lock and the reactor.

2. The system of claim 1 wherein the cooling unit comprises a channel for circulating a liquid coolant.

3. The system of claim 1 wherein the single-wafer load lock has a volume less than 5.0 liters.

4. A method of processing a semiconductor wafer comprising:
   (a) moving the wafer from a loading station to a single-wafer load lock;
   (b) moving the wafer from the single-wafer load lock to a reactor;
   (c) processing the wafer within the reactor;
   (d) moving the wafer from the reactor to the single-wafer load lock;
   (e) cooling the wafer within the single-wafer load lock; and
   (f) moving the wafer from the single-wafer load lock to the loading station,
       wherein the wafer is the only wafer contained in the load lock in the time interval between acts (a) and (b) and in the time interval between acts (d) and (f).

5. The method of claim 4 comprising loading a wafer carrier containing a plurality of wafers onto the loading station prior to performing act (a) and wherein moving a single wafer from a loading station to a single-wafer load lock comprises selecting a single wafer from the plurality of wafers in the wafer carrier.

6. A method of handling a semiconductor wafer after the wafer has been processed in a reactor, comprising:
   (a) moving the wafer from the reactor to a single-wafer load lock;
   (b) cooling the wafer in the single-wafer load lock;
   (c) venting the single-wafer load lock; and
   (d) moving the wafer from the single-wafer load lock to a loading station,
       wherein the wafer is the only wafer contained in the load lock in the time interval between acts (a) and (d).

7. The method of claim 6 wherein venting the single-wafer load lock comprises introducing an inert gas into the single-wafer load lock.

8. The method of claim 6 comprising introducing an inert gas into the reactor while the wafer is in the single-wafer load lock.

9. A single-wafer load lock for use in a wafer processing system, the single-wafer load lock containing one and only one wafer holder, the wafer holder being adapted to hold one and only one wafer, the load lock further comprising a cooling unit.

10. The single-wafer load lock of claim 9 wherein the cooling unit comprises a channel for circulating a liquid coolant.

11. The single-wafer load lock of claim 9 wherein the single-wafer load lock has a volume less than 5.0 liters.

* * * * *